(12) United States Patent
Bochiechio

(10) Patent No.: US 9,581,032 B2
(45) Date of Patent: *Feb. 28, 2017

(54) COATED ARTICLES AND MANUFACTURE METHODS

(71) Applicant: United Technologies Corporation, Hartford, CT (US)

(72) Inventor: Mario P. Bochiechio, Vernon, CT (US)

(73) Assignee: United Technologies Corporation, Farmington, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/776,154

(22) PCT Filed: Mar. 14, 2014

(86) PCT No.: PCT/US2014/027972
§ 371 (c)(1),
(2) Date: Sep. 14, 2015

(87) PCT Pub. No.: WO2014/143831
PCT Pub. Date: Sep. 18, 2014

(65) Prior Publication Data
US 2016/0017726 A1    Jan. 21, 2016

Related U.S. Application Data

(60) Provisional application No. 61/801,405, filed on Mar. 15, 2013.

(51) Int. Cl.
*F01D 5/28* (2006.01)
*C23C 28/00* (2006.01)
(Continued)

(52) U.S. Cl.
CPC ............ *F01D 5/288* (2013.01); *C23C 4/11* (2016.01); *C23C 4/134* (2016.01); *C23C 14/024* (2013.01);
(Continued)

(58) Field of Classification Search
CPC ... F01D 5/288; F01D 25/005; C23C 28/3215; C23C 28/345; C23C 4/11;
(Continued)

(56) References Cited

U.S. PATENT DOCUMENTS 3,758,417 A    9/1973 Magoon et al.
4,005,989 A    2/1977 Preston
(Continued)

FOREIGN PATENT DOCUMENTS

EP    0033505    * 8/1981    ............... C01B 3/40

OTHER PUBLICATIONS

Liu et al., "Preparation and thermophysical properties of (NdxGd1-x)2Zr2O7 ceramics", Journal of Materials Science, vol. 43, 2008, pp. 3596-3603.*

(Continued)

*Primary Examiner* — Jonathan Langman
(74) *Attorney, Agent, or Firm* — Bachman & LaPointe, P.C.

(57) ABSTRACT

An article (50; 100) has a metallic substrate (22), a bondcoat (30) atop the substrate, and a thermal barrier coating (28; 27, 28) atop the bondcoat. The thermal barrier coating or a layer thereof comprises didymium oxide ore and zirconia.

19 Claims, 4 Drawing Sheets

(51) Int. Cl.
C23C 14/02 (2006.01)
C23C 14/08 (2006.01)
C23C 14/30 (2006.01)
F01D 25/00 (2006.01)

(52) U.S. Cl.
CPC ............ *C23C 14/08* (2013.01); *C23C 14/083* (2013.01); *C23C 14/30* (2013.01); *C23C 28/3215* (2013.01); *C23C 28/345* (2013.01); *F01D 25/005* (2013.01)

(58) Field of Classification Search
CPC ....... C23C 4/134; C23C 14/024; C23C 14/08; C23C 14/083
See application file for complete search history.

(56) References Cited

U.S. PATENT DOCUMENTS

| | | | |
|---|---|---|---|
| 4,897,315 A | 1/1990 | Gupta | |
| 5,514,482 A | 5/1996 | Strangman | |
| 6,015,630 A | 1/2000 | Padture et al. | |
| 6,177,200 B1* | 1/2001 | Maloney | C23C 14/083 428/469 |
| 6,284,323 B1 | 9/2001 | Maloney | |
| 6,863,999 B1 | 3/2005 | Sudre et al. | |
| 7,186,466 B2 | 3/2007 | Zhu et al. | |
| 7,208,044 B2 | 4/2007 | Zurbuchen | |
| 7,371,352 B2* | 5/2008 | Campbell | F23C 13/00 422/177 |
| 7,713,640 B2 | 5/2010 | Zurbuchen | |
| 7,732,067 B2 | 6/2010 | Zurbuchen | |
| 7,858,952 B2 | 12/2010 | Feist et al. | |
| 8,163,403 B2 | 4/2012 | Zurbuchen | |
| 8,357,454 B2 | 1/2013 | Kulkarni et al. | |
| 2002/0061416 A1* | 5/2002 | Subramanian | C04B 35/486 428/633 |
| 2004/0011245 A1 | 1/2004 | Sambasivan et al. | |
| 2004/0038085 A1 | 2/2004 | Litton et al. | |
| 2004/0166356 A1 | 8/2004 | Liu et al. | |
| 2005/0153158 A1 | 7/2005 | Liu et al. | |
| 2005/0196635 A1 | 9/2005 | Johnson et al. | |
| 2006/0107891 A1 | 5/2006 | Zurbuchen | |
| 2006/0154093 A1* | 7/2006 | Meschter | C04B 41/009 428/469 |
| 2006/0234066 A1 | 10/2006 | Zurbuchen | |
| 2008/0057326 A1* | 3/2008 | Schlichting | C23C 4/02 428/472 |
| 2008/0241581 A1 | 10/2008 | Zurbuchen | |
| 2009/0064893 A1 | 3/2009 | Sambasivan et al. | |
| 2010/0227146 A1* | 9/2010 | Larose | C23C 4/02 428/220 |
| 2010/0247930 A1 | 9/2010 | Zurbuchen | |
| 2011/0236657 A1 | 9/2011 | Feist et al. | |
| 2011/0300357 A1 | 12/2011 | Witz et al. | |
| 2014/0364305 A1* | 12/2014 | Yamada | B01J 23/10 502/302 |
| 2016/0076136 A1* | 3/2016 | Bochiechio | C23C 14/08 428/623 |

OTHER PUBLICATIONS

C.K. Gupta and N. Krishnamurthy, Extractive Metallurgy of Rare Earths, Dec. 2004, Sections 3.3 and 3.4, CRC Press, Boca Reato, Florida, unpaginated copy retrieved Apr. 6, 2016 from http://vector.umd.edu/images/links/Extractive_Metallurgy_of_Rare_Earths_Gupta.pdf.

Miller, R.A., Thermal barrier coatings for aircraft engines: History and directions, Journal of thermal spray technology, Mar. 1997, 6(1): p. 35-42, ASM International, Materials Park, Ohio.

IPRP, for Application No. PCT/US2014/027972 dated Sep. 24, 2015.

Than-Guo Liu et al., Preparation and thermophysical properties of (NdxGd1-x)2Zr2O7 ceramics, Journal of Materials Science, May, 2008, vol. 43, Issue 10, pp. 3596-3603, Springer Science-FBusiness Media, LLC, New York, New York.

US Office action for U.S. Appl. No. 14/776,128, dated Apr. 11, 2016.

IPRP, for Application No. PCT/US2014/027893 dated Sep. 24, 2015.

European Search Report for EP Patent Application No. 14763383.8, dated Sep. 21, 2016.

Didymium Oxide, PubChem Open Chemistry Database, Aug. 8, 2009, U.S. National Library of Medicine, National Center for Biotechnology Information, Bethesda Maryland, retrieved from internet Jul. 4, 2016, https://pubchem.ncbi.hlm.nih.gov/compound/44135820.

* cited by examiner

US 9,581,032 B2

COATED ARTICLES AND MANUFACTURE METHODS

CROSS-REFERENCE TO RELATED APPLICATION

Benefit is claimed of U.S. Patent Application Ser. No. 61/801,405, filed Mar. 15, 2013, and entitled "Coated Articles and Manufacture Methods", the disclosure of which is incorporated by reference herein in its entirety as if set forth at length.

BACKGROUND

The disclosure relates gas turbine engines. More particularly, the disclosure relates to thermal barrier coatings for gas turbine engines.

Gas turbine engine gaspath components are exposed to extreme heat and thermal gradients during various phases of engine operation. Thermal-mechanical stresses and resulting fatigue contribute to component failure. Significant efforts are made to cool such components and provide thermal barrier coatings to improve durability.

Exemplary thermal barrier coating systems include two-layer thermal barrier coating systems. An exemplary system includes NiCoCrAlY bondcoat (e.g., air plasma sprayed (APS), low pressure plasma sprayed (LPPS), or cathodic arc deposited) and yttria-stabilized zirconia (YSZ) (or gadolinia-stabilized zirconia (GSZ)) thermal barrier coating (TBC) (e.g., air plasma sprayed (APS) or electron beam physical vapor deposited (EBPVD)). Prior to and while the barrier coat layer is being deposited, a thermally grown oxide (TGO) layer (e.g., alumina) forms atop the bondcoat layer. As time-at-temperature and the number of cycles increase, this TGO interface layer grows in thickness. An exemplary YSZ is 7 weight percent yttria-stabilized zirconia (7YSZ).

Exemplary TBCs are applied to thicknesses of 1-40 mils (0.025-1.0 mm) and can contribute to a temperature reduction of up to 300° F. (167° C.) at the base metal. This temperature reduction translates into improved part durability, higher turbine operating temperatures, and improved turbine efficiency.

Separately, the material known as didymium is used as safety glasses in the glassblowing and blacksmithing industries due to advantageous selective light-filtering properties. U.S. Pat. No. 3,758,417 discloses use as part of a catalyst system. Commercially, didymium ore is obtained from the mineral monazite. The mineral bastnaesite could also be used as source from which didymium ore mixtures are derived.

Monazite is rare earth phosphate combination of approximately 70 percent rare earth oxide (REO). The exact process by which monazite is refined into rare earth ore varies slightly by the deposit from which it is refined. In general, monazite is found as a minor constituent within placer deposits of heavy minerals. Monazite is commonly found intermixed with sillimanite, garnet, and magnetite. Major minerals commonly found with monazite include ilmenite, rutile, zircon, and quartz. Separation of the heavy mineral deposits is accomplished through a series of separation sequences that exploit the small differences in mass, magnetic susceptibility, and electrochemical properties. The number and order of operations is predicated on the source of the deposit and purity of the heavy mineral deposits.

Recovery of REO from monazite involves a complex series of operations by which the rare earths are separated from the radioactive components of the mineral. Monazite is dissolved into solution using caustic soda (NaOH). This mixture is then washed and filtered. Two byproducts are evolved from this step are a mixed rare earth (RE)-thorium-uranium hydroxide and a filtrate containing sodium phosphate. Hydrochloric acid is then added to the RE-Th-U hydroxide solution. The solution is subsequently filtered and washed to separate the radioactive constituents, uranium and thorium, from the desired RE components. The filtrate from this process is neutralized by chemical processing to yield a RE chloride mixture. The remaining liquid fraction is treated either with caustic soda and/or sodium bicarbonate to form additional RE hydroxide or RE carbonate. Similar processing is also used to digest bastnasite RE minerals, however additional processing steps are included to remove additional elemental contaminants from the desired RE elements.

Cerium is the first RE to be removed from the mixture of lanthanide elements. This can be accomplished by drying the rare earth hydroxide mixture and then oxidizing cerium (III) to cerium (IV) in the presence of ozone. The mixture is then dissolved in nitric acid. The subsequent mixture is filtered leaving a cerium-free RE solution and cerium (IV) dioxide filtrate. The remaining mixture of rare earths can be further processed by a series complex ion exchange and digestion methods to separate the mixture into each elemental constituent or the mixture can be thermally treated in an oxidizing environment to convert the mixture to the didymium oxide ore mixture noted in Table III below. See, e.g., Extractive Metallurgy of Rare Earths, C. K. Gupta and N. Krishnamurthy, CRC Press 2004.

U.S. Pat. No. 6,863,999 identifies use of a lanthanum monazite phosphate in a thermal barrier coating.

SUMMARY

One aspect of the disclosure involves an article having a metallic substrate, a bondcoat atop the substrate, and a thermal barrier coating atop the bondcoat. The thermal barrier coating or a layer thereof comprises didymium oxide ore and zirconia.

In one or more embodiments of any of the foregoing embodiments, the thermal barrier coating or layer has improved resistance to molten silicate, CMAS, salts (e.g., relative to a pure 7YSZ baseline).

In one or more embodiments of any of the foregoing embodiments, the didymium oxide ore in said thermal barrier coating or layer thereof is at a concentration of at least one of 15-60 mole percent and 32-80 weight percent and the zirconia in said thermal barrier coating or layer thereof is at a concentration of at least one of 85-40 mole percent and 20-68 weight percent.

In one or more embodiments of any of the foregoing embodiments, the didymium oxide ore in said thermal barrier coating or layer thereof is at a concentration of at least one of 25-35 mole percent and 47-59 weight percent and the zirconia in said thermal barrier coating or layer thereof is at a concentration of at least one of 65-75 mole percent and 41-53 weight percent.

In one or more embodiments of any of the foregoing embodiments, the thermal barrier coating or layer thereof has a characteristic thickness of at least 25 micrometers and the bondcoat has a characteristic thickness of at least 20 micrometers.

In one or more embodiments of any of the foregoing embodiments, the substrate comprises a nickel-based superalloy.

In one or more embodiments of any of the foregoing embodiments, the article is a gas turbine engine component.

In one or more embodiments of any of the foregoing embodiments, the thermal conductivity of the resulting ceramic system is between 0.8 and 1.2 (W m−1 K−1).

In one or more embodiments of any of the foregoing embodiments, the thermal barrier coating possesses resistance to molten silicate, CMAS, salts.

In one or more embodiments of any of the foregoing embodiments, the thermal barrier coating comprises said layer and at least one YSZ layer between the bondcoat and said layer.

In one or more embodiments of any of the foregoing embodiments, the thermal barrier coating further comprises a mixed phase field of fluorite and pyrochlore crystal structure-rare earth zirconate $A_2B_2O_7$ between said layer and said at least one YSZ layer.

In one or more embodiments of any of the foregoing embodiments, the thermal barrier coating comprises a plurality of said layers alternating with a plurality of said at least one YSZ layer.

In one or more embodiments of any of the foregoing embodiments, a method for manufacturing the article comprises: applying the bondcoat; and applying the didymium oxide ore and the zirconia forming didymium zirconate.

In one or more embodiments of any of the foregoing embodiments, the applying the didymium oxide ore and the zirconia comprises mixing and forming an ingot and vaporizing the ingot.

In one or more embodiments of any of the foregoing embodiments, the applying the didymium oxide ore and the zirconia comprises EB-PVD.

Another aspect of the disclosure involves a method for coating an article, the method comprising: applying a bondcoat; and applying a combination of didymium oxide ore and zirconia forming didymium zirconate.

The details of one or more embodiments are set forth in the accompanying drawings and the description below. Other features, objects, and advantages will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
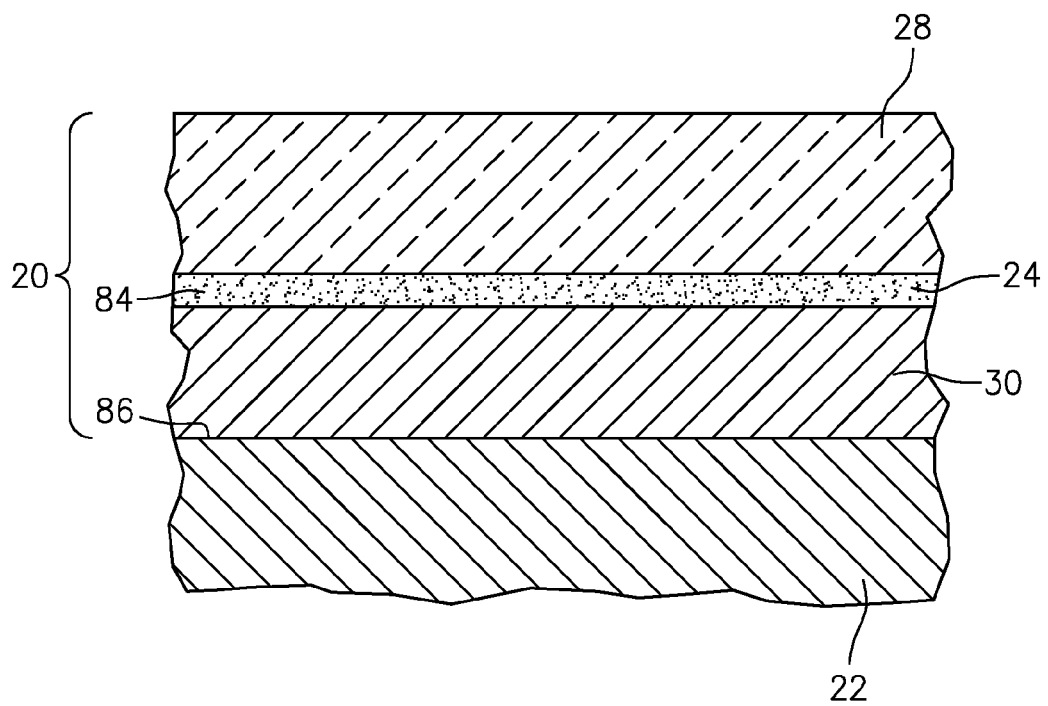
FIG. 1 is a partially schematic sectional view of substrate having a thermal barrier coating (TBC).

FIG. 1 shows a thermal barrier coating system 20 atop a metallic substrate 22. In an exemplary embodiment, the substrate is a nickel-based superalloy or a cobalt-based superalloy such as a cast component (e.g., a single crystal casting) of a gas turbine engine. Exemplary components are hot section components such as combustor panels, turbine blades, turbine vanes, and air seals.

Exemplary substrate compositional ranges are shown in Table I:

TABLE I

Exemplary Superalloy Compositions

| Alloy | | Cr | Co | C | Ti | Al | W | Mo | Nb | Hf | Ta | Re | Ni |
|---|---|---|---|---|---|---|---|---|---|---|---|---|---|
| Broad | Min | 3 | 0 | 0 | 0 | 4 | 3 | 0 | 0 | 0 | 6 | 0 | Balance |
| Range | Max | 12 | 15 | 0.045 | 10 | 7 | 10 | 3 | 1 | 0.8 | 12 | 5 | Balance |
| Example | | 5 | 10 | — | — | 5.6 | 6.0 | 2.0 | — | 0.1 | 9.0 | 3.1 | Balance |

In some embodiments of the materials in Table I (and Tables II and III below), the materials may consist essentially of the listed elements (e.g., with at most trace amounts of other elements). In some embodiments, other elements may be present in individual quantities less than 2.0 weight percent and/or aggregate quantities less than 5.0 weight percent, more narrowly 1.0 weight percent individually and 2.0 weight percent aggregate.

The coating system 20 may include a bondcoat 30 atop a surface 26 of the substrate 22 and a thermal barrier coating (TBC) system 28 atop the bondcoat. A thermally grown oxide (TGO) layer 24 may form at the interface of the bondcoat to the TBC. The exemplary bondcoat is a single-layer bondcoat. Alternatives may have two or more layers. In the exemplary system, the bondcoat consists of or consists essentially of the single layer (e.g., subject to relatively small gradation/transition with each other and with the TBC as noted above).

The exemplary TBC is also a single-layer TBC. Alternatives may involve a multi-layer TBC with at least two layers. In the exemplary system, the TBC consists of or consists essentially of the single layer (e.g., subject to relatively small gradation/transition the bondcoat as noted above).

Figure 2:
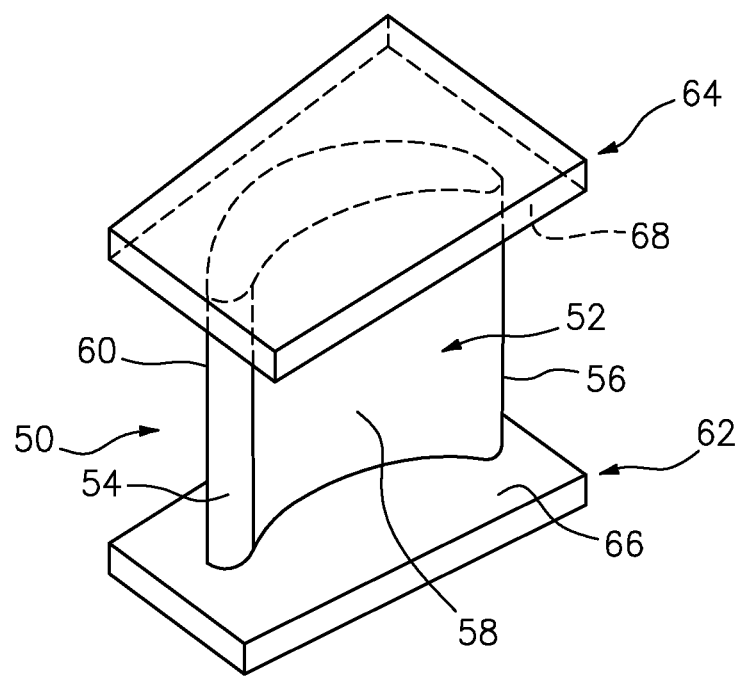
FIG. 2 is a partially schematic view of a vane bearing the TBC.

FIG. 2 shows a vane 50 comprising the cast metallic substrate 22. The vane includes an airfoil 52 having a surface comprising a leading edge 54, a trailing edge 56, a pressure side 58, and a suction side 60. The airfoil extends from an inboard end at a platform or band segment 62 to an outboard end and an outboard shroud or band segment 64. The segments 62 and 64 have respective gaspath surfaces 66 and 68. These are essentially normal to the airfoil surfaces. The TBC system extends at least along the surface of the airfoil and the surfaces 66 and 68.

Figure 3:
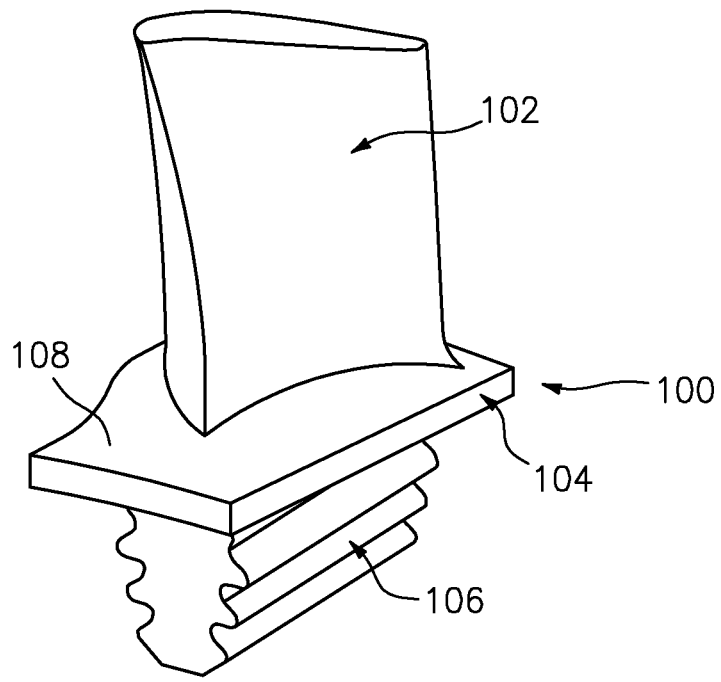
FIG. 3 is a partially schematic view of a blade bearing the TBC.

FIG. 3 shows a blade 100 having an airfoil 102 extending outward from a platform 104. The blade includes an attachment root 106 inboard of the platform. The platform 104 has an outboard gaspath surface 108.

The exemplary bondcoat 30 is an overlay MCrAlY bondcoat. An exemplary MCrAlY overlay bondcoat is a NiCoCrAlYHfSi. Alternative bondcoats are diffusion of aluminides or platinum aluminides. Table II provides exemplary bondcoat compositions:

TABLE II

Exemplary MCrAlY Compositions

| | Range | Cr | Co | Mo | W | Ta | Re | Al | Y | Si | Hf | Zr | Ni |
|---|---|---|---|---|---|---|---|---|---|---|---|---|---|
| Broad | Min | 4 | 6 | 0 | 1 | 1 | 0 | 2 | 0 | 0 | 0 | 0 | Bal. |
| | Max | 20 | 25 | 2 | 10 | 10 | 2 | 14 | 2 | 1 | 2 | 2 | Bal. |
| Intermediate | Min | 8 | 10 | 0.1 | 3 | 3 | 0.2 | 4 | 0.2 | 0.2 | 0.2 | 0 | Bal. |
| | Max | 12 | 14 | 2 | 6 | 6 | 0 | 8 | 1 | 1 | 1 | 0.5 | Bal. |
| Example 1 | Highly Alloyed Metallic Coating | 10 | 12 | 1 | 4.5 | 4.5 | 1 | 6 | 0.5 | 0.5 | 0.5 | .25 | Bal |
| Example 2 | NiCrAlY | 19.5 | — | — | — | — | — | 12.5 | 0.45 | — | — | — | Bal. |
| Example 3 | NiCoCrAlY | 18 | 23 | — | — | — | — | 12.5 | 0.3 | — | — | — | Bal. |
| Example 4 | NiCoCrAlYHfSi | 17 | 22 | — | — | — | — | 12.5 | 0.6 | — | 0.4 | 0.3 | Bal. |

Exemplary bondcoat thicknesses are 2-500 micrometers, more narrowly, 12-250 micrometers or 25-150 micrometers on average.

The exemplary TBC provides a mixture didymium oxide ore zirconate. Table III shows two nominal commercially recorded compositions for didymium ore oxides:

TABLE III

Exemplary Didymium Ore Oxide Mixture Compositions

| | | Weight Percent (wt %) | | | | | | | | Molecular |
|---|---|---|---|---|---|---|---|---|---|---|
| | Range | $La_2O_3$ | $Pr_6O_{11}$ | $Nd_2O_3$ | $Sm_2O_3$ | $Y_2O_3$ | $CeO_2$ | $Gd_2O_3$ | Other REO | Weight (grams) |
| Broad | Min | 31 | 7 | 30 | 1 | 0 | 1 | 1 | 0 | |
| | Max | 53 | 12 | 37 | 9 | 6 | 1 | 12 | 7 | |
| Narrow | Min | 40 | 8 | 30 | 3 | 0 | 1 | 2 | 0 | |
| | Max | 50 | 10 | 34 | 7 | 4 | 1 | 7 | 5 | |
| Nominal | Didymium Ore Mixture 1 | 46 | 10 | 32 | 5 | 0.4 | 1 | 3 | 2.6 | 334.4 |
| Nominal | Didymium Ore Mixture 2 | 45 | 10 | 33 | 3 | 1 | 1 | 3 | 4 | 327.5 |

Seven individual oxides are specifically identified and the final column identifies the total content of other rare earth oxides in molar percentages. Two ranges of different breadths are also given. The broad range in Table III encompasses the chemical variations in monazite deposits in placer deposits from around the world. The narrow range is typical of what is extracted from active mining facilities. The two nominal commercial compositions are derived from the products of heavy mineral sands from two different monazite deposits. While similar in nominal composition, there are enough differences in the derived typical nominal chemistry that they can be considered to be different products and one or the other may have more beneficial properties in a given situation. Thus, the ranges are given to encompass both. In a first example, the FIG. 1 TBC comprises 15-60 molar percent didymium oxide ore. The majority of the remainder, preferably essentially all of the remainder (e.g., 95% or more by weight) being zirconia. A more particular range composition is 25-35 molar percent didymium oxide ore with a similar balance zirconia. This may be applied EB-PVD or other appropriate process resulting in the formation of a rare earth zirconate. A rare earth zirconate the term used to describe the alloyed mixture of the rare earth oxide and zirconia. It is commonly used in reference to the line compound of the composition $M_2Zr_2O_7$ (i.e. $Gd_2Zr_2O_7$—gadolinium zirconate). More broadly it can be used to describe the solid solution of the desired metal oxide, $M_2O_3$ in conjunction with zirconia, ($ZrO_2$). Exemplary TBC layer thickness is in excess of 25 micrometers, more particularly, in excess of 50 micrometers or 25-130 micrometer.

Figure 4:
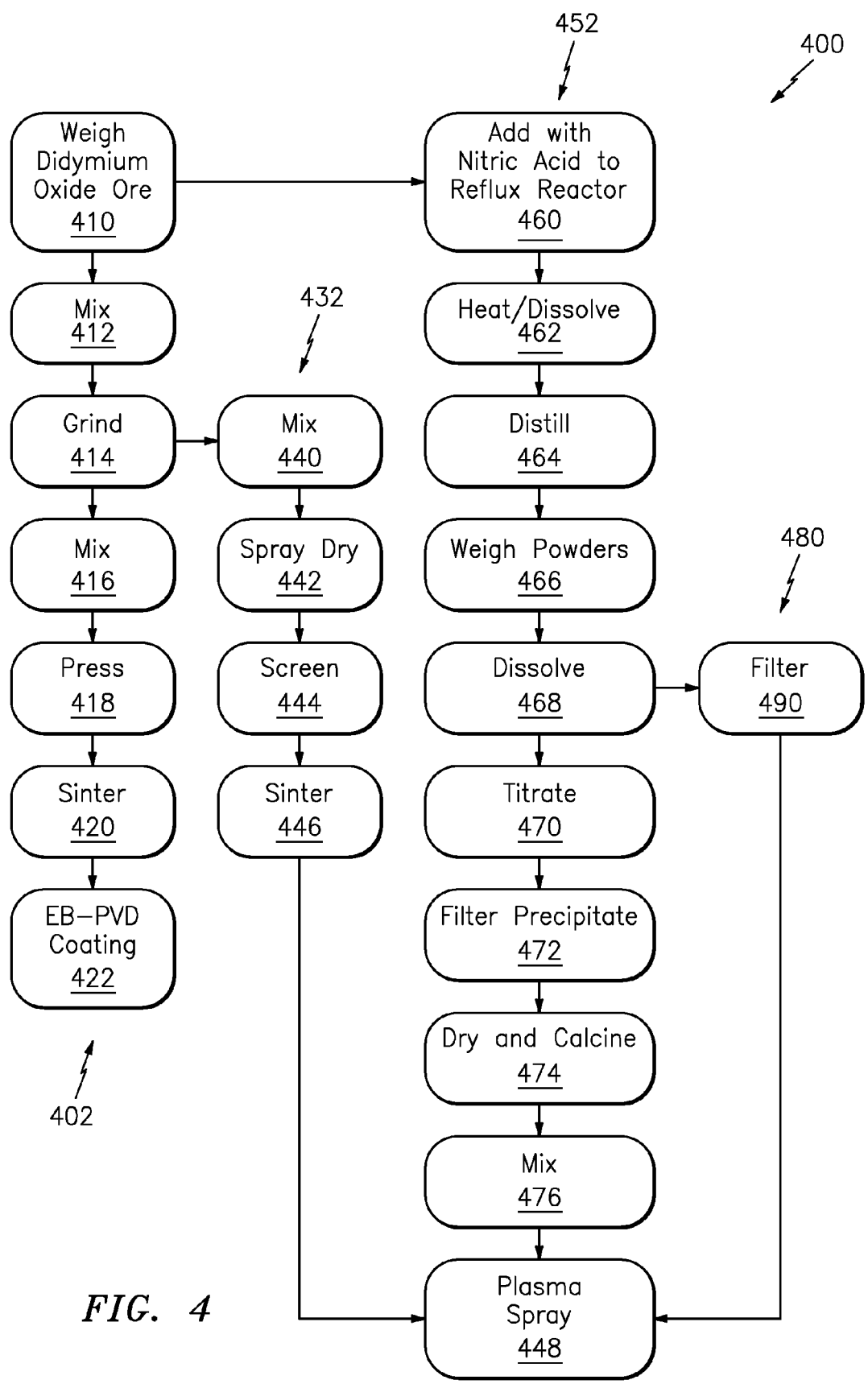
FIG. 4 is a flowchart of a process for coating the substrate of FIG. 1.

Exemplary deposition methods include plasma spray deposition and electron beam physical vapor deposition (EB-PVD). FIG. 4 shows an exemplary process with several branches showing several variations including three exemplary plasma spray variations and one exemplary EB-PVD variation. In the EB-PVD variation 402, an appropriate amount of didymium oxide ore is weighed 410. It is then mixed 412 with zirconium oxides. The mixed powder is then ground 414. The ground powders are then mixed 416 with binder. The mixed powder/binder is then pressed 418 into an ingot. The ingot is then sintered 420. The sintered ingot is then used in EB-PVD coating 422 in a conventional manner.

In a first plasma spray variation 432, the weighing, mixing, and grinding may be performed but then the mixed/ground powders are then mixed 440 with binder and water to form a slurry. The slurry is spray dried 442 to form powders. The dried powders are screened 444. The screened powders are sintered 446. The sintered powders may be plasma sprayed 448 in conventional form. A second plasma spray variation 452 branches off earlier after the weighing of didymium oxide ore. The didymium oxide ore is added 460 with concentrated nitric acid to a reflux reactor. The reactor is heated 462 (e.g., to 100° C. to 250° C.) to dissolve the didymium oxide ore.

The reacted product is then distilled 464 to form didymium nitrate. Amounts of didymium nitrate and a soluble zirconium salt powders are then weighed 466. The powders are dissolved 468 (e.g., in deionized water). Ammonium hydroxide is then titrated 470 into solution. The resulting precipitate is filtered 472 into a cake. The cake is dried and calcined 474. The dried and calcined cake forms a powder which is mixed 476 with solvent and dispersant which may then be plasma sprayed.

In a further variation 480, after the dissolving 468 the solution is filtered 490 and the filtered solution may directly be plasma sprayed.

Figure 5:
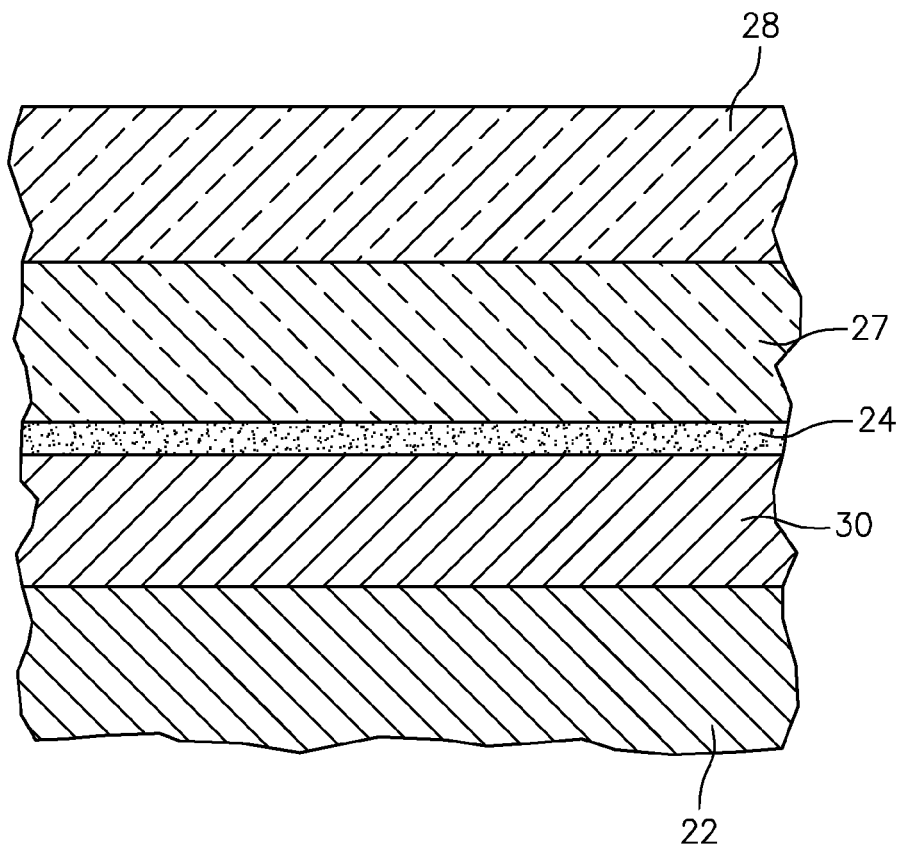
FIG. 5 is a partially schematic sectional view of substrate having a second thermal barrier coating (TBC).

FIG. 5 shows a two-layer thermal barrier coating system. An underlayer 27 comprises or consists essentially of yttria-stabilized zirconia (e.g., 4-25 weight percent yttria, or more particularly, 6-12 percent or a nominal 7 percent). A second layer 28 (e.g., an outer layer) is deposited atop the underlayer and has the composition noted for the FIG. 1 example. Exemplary YSZ layer thickness is at least 25 micrometer. Exemplary didymium oxide ore zirconate layer thickness is at least 25 micrometers.

Figure 6:
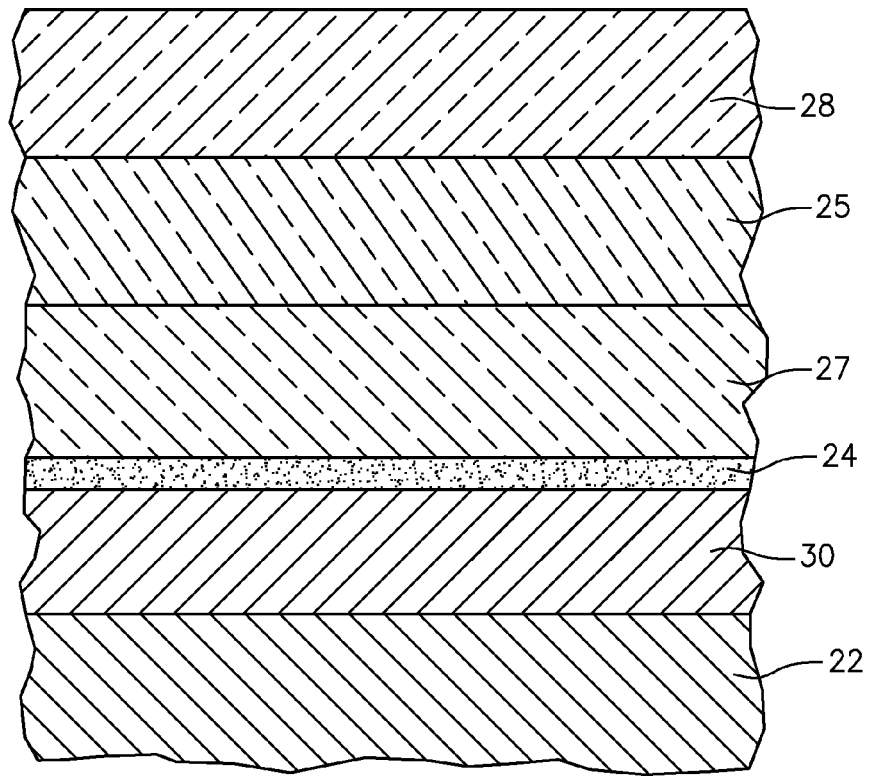
FIG. 6 is a partially schematic sectional view of substrate having a third thermal barrier coating (TBC).

FIG. 6 shows a system otherwise similar to the FIG. 1 system but wherein a third layer 25 intervenes between the YSZ underlayer 27 and the didymium oxide ore-zirconia layer 28. The exemplary intervening layer 25 is a flourite/pyrochlore zirconate $A_2B_2O_7$. This layer may be characterized as a stabilized zirconia coating comprising an oxide of La, Ce, Pr, Nd, Pm, Sm, Eu, Gd, Tb, Dy, Ho, Er, Tm, Yb, Lu, Mg, Ca, Hf, Sr, 5-60 mol %, more narrowly, 25-35%. Exemplary thickness of the intervening layer is at least 25 micrometers, more particularly 25-130 micrometers.

Figure 7:
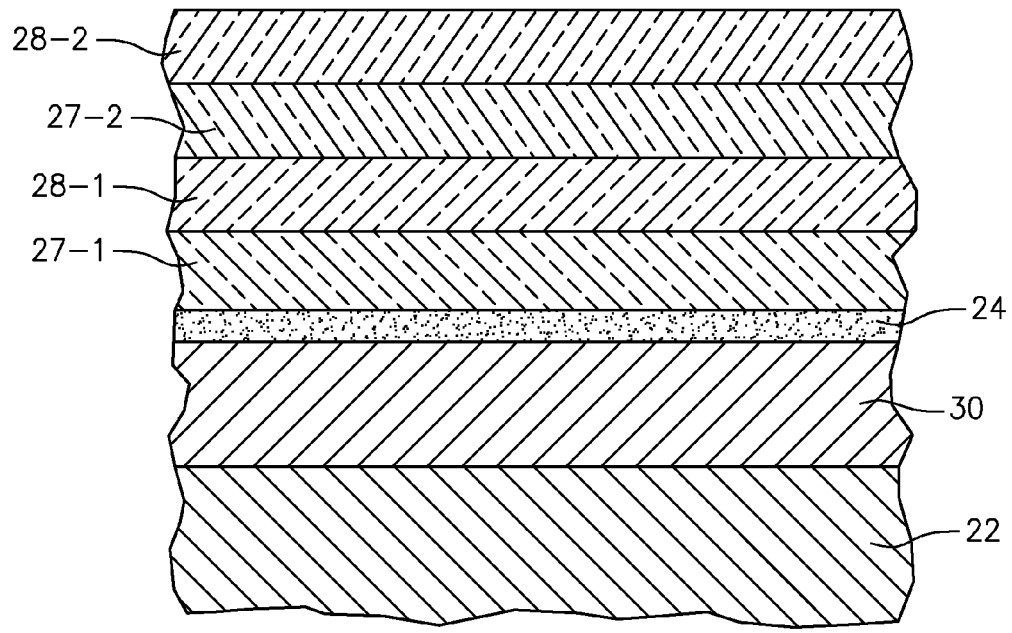
FIG. 7 is a partially schematic sectional view of substrate having a fourth thermal barrier coating (TBC).

FIG. 7 shows an alternative embodiment where there are alternating layers: YSZ layers 27-1, 27-2; and the didymium oxide ore-zirconia layers 28-1, 28-2 (two pairs being shown but more being possible). Exemplary thicknesses of each layer are in excess of 25 micrometers, more particularly 25-130 micrometers. Exemplary overall thickness may be in the overall range above.

The use of "first", "second", and the like in the following claims is for differentiation within the claim only and does not necessarily indicate relative or absolute importance or temporal order. Similarly, the identification in a claim of one element as "first" (or the like) does not preclude such "first" element from identifying an element that is referred to as "second" (or the like) in another claim or in the description.

Where a measure is given in English units followed by a parenthetical containing SI or other units, the parenthetical's units are a conversion and should not imply a degree of precision not found in the English units.

One or more embodiments have been described. Nevertheless, it will be understood that various modifications may be made. For example, when applied to an existing basic article configuration, details of such configuration or its associated engine may influence details of particular implementations. Accordingly, other embodiments are within the scope of the following claims.

What is claimed is:

1. An article comprising:
a metallic substrate;
a bondcoat atop the substrate; and
a thermal barrier coating atop the bondcoat,
wherein the thermal barrier coating or a layer thereof comprises:
didymium oxide ore; and
zirconia.

2. The article of claim 1 wherein:
the didymium oxide ore in said thermal barrier coating or layer thereof is at a concentration of at least one of 15-60 mole present and 32-80 weight percent; and
the zirconia in said thermal barrier coating or layer thereof is at a concentration of at least one of 85-40 mole percent and 20-68 weight percent.

3. The article of claim 1 wherein:
the didymium oxide ore in said thermal barrier coating or layer thereof is at a concentration of at least one of 25-35 mole percent and 47-59 weight percent; and
the zirconia in said thermal barrier coating or layer thereof is at a concentration of at least one of 65-75 mole and 41-53 weight percent.

4. The article of claim 1 wherein:
the thermal barrier coating or layer thereof has a characteristic thickness of at least 25micrometers; and
the bondcoat has a characteristic thickness of at least 20 micrometers.

5. The article of claim 1 wherein:
the substrate comprises a nickel-based superalloy.

6. The article of claim 1 wherein:
the article is a gas turbine engine component.

7. The article of claim 1 wherein:
the thermal conductivity of the thermal barrier coating is between 0.8 and 1.2 (W m−1 K−1).

8. The article of claim 1 wherein:
the thermal barrier coating possesses resistance to molten silicate, CMAS, and salts.

9. The article of claim 1 wherein:
the thermal barrier coating comprises:
said layer of the thermal barrier coating; and
at least one YSZ layer between the bondcoat and said layer.

10. The article of claim 9 wherein:
the thermal barrier coating further comprises:
a mixed phase field of fluorite and pyrochlore crystal structure-rare earth zirconate $A_2B_2O_7$ between said layer said at least one YSZ layer.

11. The article of claim 9 wherein:
the thermal barrier coating comprises a plurality of said layers alternating with a plurality of said at least one YSZ layer.

12. The article of claim 1 being a vane.

13. The article of claim 1 being a blade.

14. A method for manufacturing the article of claim 1, the method comprising:
applying the bondcoat; and
applying the didymium oxide ore and the zirconia forming didymium zirconate.

15. The method of claim 14 wherein:
the applying the didymium oxide ore and the zirconia comprises mixing and forming an ingot and vaporizing the ingot.

16. The method of claim 14 further comprising:
the applying the didymium oxide ore and the zirconia comprises EB-PVD.

17. A method for coating an article, the method comprising:
applying a bondcoat; and
applying a combination of didymium oxide ore and zirconia forming didymium zirconate.

18. The method of claim 17 wherein the article is a vane.

19. The method of claim 17 wherein the article is a blade.

* * * * *